(12) United States Patent
Fu et al.

(10) Patent No.: US 11,815,571 B2
(45) Date of Patent: Nov. 14, 2023

(54) ELECTRIC CURRENT SENSOR AND SENSING DEVICE

(71) Applicant: Voltafield Technology Corporation, Jhubei (TW)

(72) Inventors: Nai-Chung Fu, Jhubei (TW); Chien-He Hou, Jhubei (TW); Chih-Chao Shih, Jhubei (TW); Fu-Tai Liou, Jhubei (TW)

(73) Assignee: VOLTAFIELD TECHNOLOGY CORPORATION, Jhubei (TW)

( * ) Notice: Subject to any disclaimer, the term of this patent is extended or adjusted under 35 U.S.C. 154(b) by 0 days.

(21) Appl. No.: 17/735,202

(22) Filed: May 3, 2022

(65) Prior Publication Data

US 2022/0373619 A1 Nov. 24, 2022

(30) Foreign Application Priority Data

May 18, 2021 (TW) .................................. 110117975

(51) Int. Cl.
  *G01R 33/09* (2006.01)
  *G01R 33/00* (2006.01)
(52) U.S. Cl.
  CPC ....... *G01R 33/096* (2013.01); *G01R 33/0094* (2013.01); *G01R 33/093* (2013.01)
(58) Field of Classification Search
  CPC .............. G01R 33/096; G01R 33/0094; G01R 33/093; G01R 33/0076; G01R 33/091; G01R 15/20
  See application file for complete search history.

(56) References Cited

U.S. PATENT DOCUMENTS

| 8,749,232 | B2 | 6/2014 | Fu et al. | |
| 9,128,141 | B2 | 9/2015 | Liou et al. | |
| 9,335,386 | B2 | 5/2016 | Fu et al. | |
| 9,651,636 | B2 | 5/2017 | Fu et al. | |
| 2013/0082699 | A1* | 4/2013 | Fu .................. | G01R 33/0011 324/252 |
| 2013/0138372 | A1* | 5/2013 | Ausserlechner ..... | G01R 35/005 702/65 |
| 2015/0008913 | A1* | 1/2015 | Fu .................... | G01R 33/096 324/252 |
| 2019/0212372 | A1* | 7/2019 | Bilbao De Mendizabal ............... | G01R 15/205 |

* cited by examiner

*Primary Examiner* — Alvaro E Fortich
(74) *Attorney, Agent, or Firm* — Locke Lord LLP; Tim Tingkang Xia, Esq.

(57) ABSTRACT

The present invention provides an electric current sensor comprising a substrate and MR sensing circuit. The substrate has a first surface along a first axis and a second axis. The MR sensing circuit is utilized to detect a magnetic filed about a third axis. The MR sensing circuit is formed onto the first surface and has a plurality of MR sensor pairs. Each MR sensor in each MR sensor pair has a plurality of conductive structures, wherein the conductive structures of one MR sensor are symmetrically arranged. Alternatively, the present invention provides an electric current sensing device using a pair of electric sensors symmetrically arranged at two lateral sides of a conductive wire having an electric current flowing therethrough for eliminating the magnetic field along Z axis generated by external environment.

13 Claims, 11 Drawing Sheets

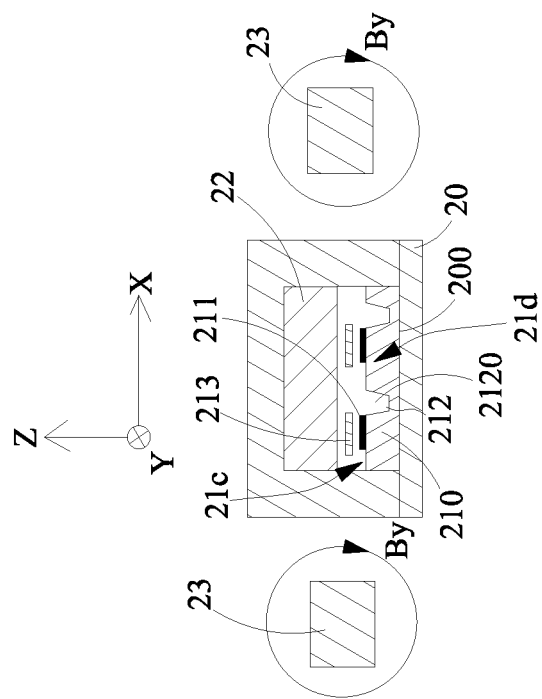
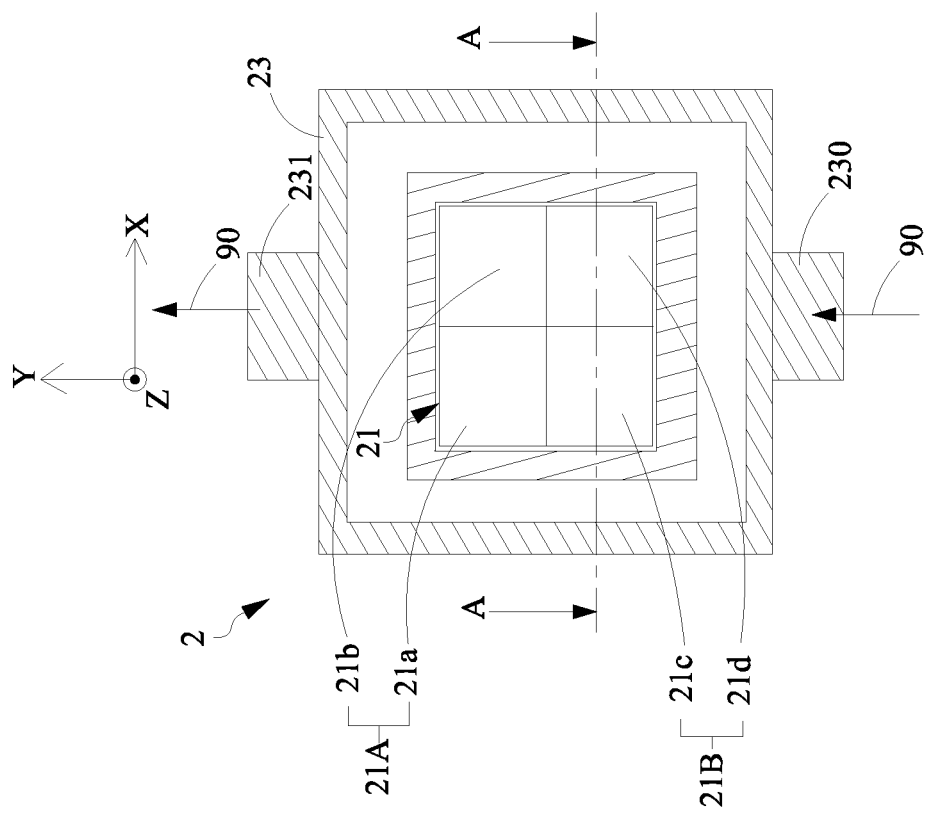
FIG. 2B
FIG. 2A

ELECTRIC CURRENT SENSOR AND SENSING DEVICE

CROSS-REFERENCE TO RELATED APPLICATIONS

This application claims the benefit of Taiwan Patent Application Serial No. 110117975, filed on May 18, 2021, the subject matter of which is incorporated herein by reference.

BACKGROUND OF INVENTION

1. Field of the Invention

The present invention is related to a technology for detecting the electric current, and more particularly, to an electric current sensor and sensing device formed by magnetoresistance (MR) sensing elements.

2. Description of the Prior Art

With the advance of the technology, the operation of electrical device is popularly spread in each industrial field, wherein the detection of electrical characteristics, power consumption management, or abnormal detection of electrical leakage are the main items related to managing and monitoring the operation of the electrical device. Among those managing or monitoring items, the electric current sensor is the main element for assisting the monitoring and managing objectives.

Conventionally, the technology for detecting electric current can be divided into many different implementation fields, including but should not be limited to, shunt resistor operated according to the Ohm's law, transformer operated according to the Faraday's law, Rogowski coil, fluxgate, Hall element, optical polarity according to the Faraday's law, and magentoresistance sensing measures such as anisotropic magnetoresistance (AMR), giant magnetoresistance (GMR), or tunnel magnetoresistance (TMR), for example. In recent years, since the miniaturized electrical device has become the main trend of technology development, how to provide highly accurate, highly responding rate, small volume and low power consumption electric current sensor becomes the main objective of research and design.

In the conventional arts, such as Hall sensor for detecting the electric current, for example, although it can achieve the objective of detecting electric current as well as detecting large magnetic field range, the Hall sensor still has drawbacks of high temperature drift, low bandwidth, and low accuracy.

Please refer to the FIG. 1, which illustrates a top view of the conventional electric current sensing device formed by the conventional MR sensor. The electric current sensing device 1 comprises a substrate 100, a conductive wire 110, a first AMR element 111, a second AMR element 112, a third AMR element 113, and a forth AMR element 114. The conductive wire 110 has a first conductive wire C1, and a second conductive wire C2 spaced apart along a first axis X, and each of which is extended along a second axis Y, respectively and is arranged blow the substrate 100 having first end 115 and second end 116 opposite to each other associated with the first axis X. The electric current sensing device 1 is arranged in a space composed of the first axis X, the second axis Y, and the third axis Z orthogonal to each other. According to the electric current sensing device shown in FIG. 1, although it has high accuracy, it still has drawback of low magnetic field range. In addition, the chip formed by the layout shown in FIG. 1 still has issues of large bulk volume and low efficiency.

Accordingly, there has a need of electric current sensor and sensing device for solving the issues and drawbacks of the conventional arts.

SUMMARY OF THE INVENTION

The present invention provides an electric current sensor and sensing device for detecting a magnetic field induced by an electric current wherein the electric current sensor comprises a plurality of pairs of magnetic field sensor, and each pair of magnetic field sensor has a symmetric conductive structures. The magnetic field sensor comprises a horizontal magnetoresistive layer, a conductive portion, and a first magnetic field sensing layer formed by a plurality of troughs whereby the operation characteristics, including large field range, high accuracy, high bandwidth, and low temperature drift, of the magnetic field sensor can be effectively improved.

The present invention provides an electric current sensor and sensing device, each of which comprises a plurality of magnetic field sensor utilized to detect a magnetic field, which is induced by the current. The material and manufacturing process for making the electric current sensor and sensing device can enable the magnetic field sensor and MR sensing elements for detecting magnetic field parallel and/or orthogonal to the surface of the substrate to be easily integrated into the same chip.

The present invention provides a current sensing device comprising a pair of current sensors respectively arranged on both sides of a conductive wire so as to eliminate the three-axis magnetic field generated in the external environment, especially eliminating the magnetic field in the Z-axis direction.

In one embodiment, the present invention provides a current sensor comprising a substrate and a sensing circuit. The substrate has a first surface formed by a first axis (X) and a second axis (Y). The sensing circuit is formed on the first surface and is used for sensing a third axial magnetic field (Bz). The sensing circuit has a plurality of pairs of magnetic field sensors, wherein each pair of magnetic field sensors has a symmetrical conductive structure.

The present invention provides a current sensor comprising a substrate, a magnetic field sensor and a shield structure. The substrate has a first surface formed by a first axis and a second axis. The magnetic field sensor, formed on the first surface, is used for sensing a magnetic field in a third axial direction. The shield structure is formed at one side of the magnetic field sensor.

In one embodiment, the present invention provides a current sensing device comprising a pair of current sensors for sensing the electric current of a wire along the Y-axis direction. The pair of current sensors is symmetrically arranged at both sides of a conductive wire, wherein each current sensor further comprises a substrate, a magnetic field sensor and a shield structure. The substrate has a first surface formed by a first axis and a second axis. The magnetic field sensor, formed on the first surface, is used for sensing a magnetic field in a third axial direction. The shield structure is formed at one side of the magnetic field sensor.

In one embodiment, the present invention provides a current sensing device having a plurality of electric current sensors for sensing the electric current of a conductive wire along the Y-axis direction. The plurality of current sensors are symmetrically arranged to form a Wheatstone bridge on both sides of the conductive wire or a half-Wheatstone bridge circuit at one side of the conductive wire, and each current sensor further comprises a substrate, a magnetic field sensor and/or a shield structure. The substrate has a first surface formed by a first axis and a second axis. The magnetic field sensor, formed on the first surface, is used for sensing a magnetic field about a third axial direction. The shield structure is formed on one side of the magnetic field sensor.

In one embodiment, the magnetic field sensor further comprises a horizontal magnetoresistive layer, a conductive portion, and at least one magnetic field sensing layer. The horizontal magnetoresistive layer, formed on the first surface of the substrate, has a first side and a second side opposite to the first side along a lengthwise extending direction thereof. The conductive portion, having the plurality of conductive structures, is formed above or below the horizontal magnetoresistive layer, wherein the horizontal magnetoresistive layer and the conductive portion form at least one current path, and the direction of the electric current in the horizontal magnetoresistive layer is not parallel to the lengthwise direction of the horizontal magnetoresistive layer. The at least one magnetic field sensing layer is formed on the first side, the second side or the first side and the second side of the horizontal magnetoresistive layer, and each magnetic field sensing layer has sidewalls connected to each other.

BRIEF DESCRIPTION OF THE DRAWINGS

The present invention will now be specified with reference to its preferred embodiment illustrated in the drawings, in which:

FIG. 2A and FIG. 2B are respectively referred to the schematic top and cross-sectional views of one embodiment of a current sensor of the present invention;

DESCRIPTION OF THE PREFERRED EMBODIMENT

Figure 1:
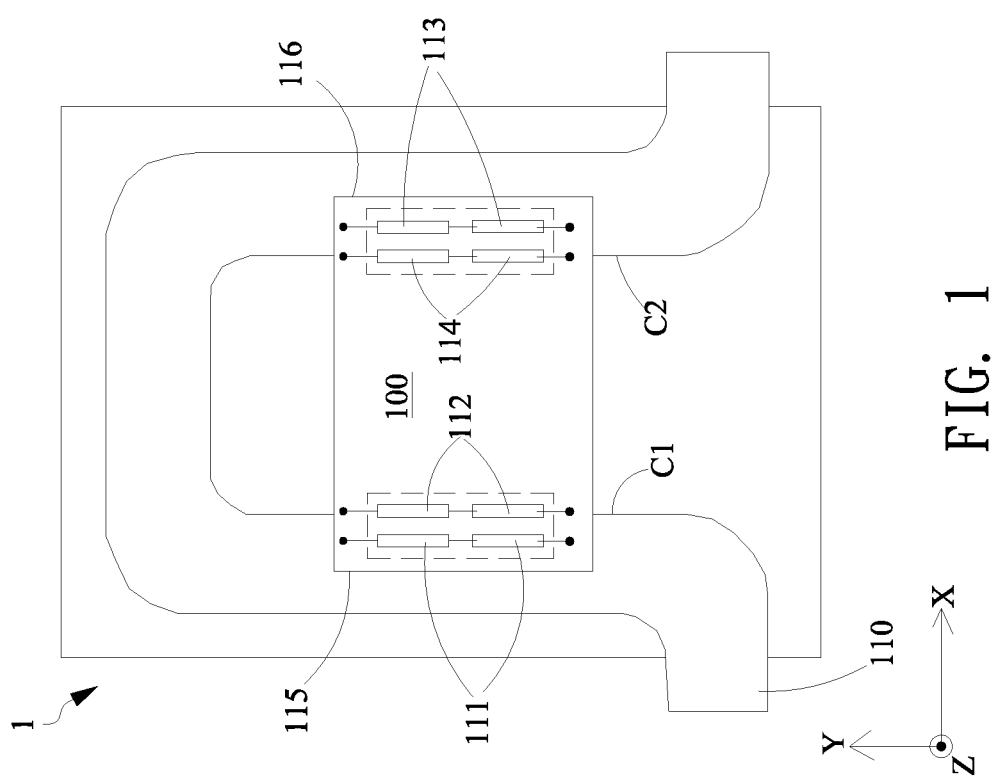
FIG. 1 is a schematic top view of a conventional current sensor.

The invention disclosed herein is directed to electric current sensor and sensing device. In the following description, numerous details corresponding to the aforesaid drawings are set forth in order to provide a thorough understanding of the present invention so that the present invention can be appreciated by one skilled in the art, wherein like numerals refer to the same or the like parts throughout.

It is noted that when introducing elements of the examples disclosed herein, the term "a," "an," and "the" are intended to mean that there are one or more of the elements. The terms "comprise or comprising", "include or including", "have or having", and "contain or containing" are intended to be open ended and mean that there may be additional elements other than the listed elements. In addition, the phrase "and/or," as used herein in the specification and in the claims, should be interpreted as the any one or combination of at least one, or a number of listed embodiments.

Although the terms first, second, etc. may be used herein to describe various elements, components, modules, and/or zones, these elements, components, modules, and/or zones should not be limited by these terms. Various embodiments will now be described in conjunction with a number of schematic illustrations. The embodiments which are set forth the device for cultivating cells and method for making the same are different from the conventional approaches. Various embodiments of the application may be embodied in many different forms and should not be construed as a limitation to the embodiments set forth herein.

In the present specification, the magnetic field sensing layer and the magnetoresistive layer can be respectively made of or made from magnetic material whose electric resistance is particularly capable of being varied with respect to the variation of the external magnetic field. Each magnetic field sensing layer or the magnetoresistive layer can be a single film, multiple discrete films or multiple continuously overlapped films, such as the anisotropic magnetoresistance (AMR), giant magnetoresistance (GMR), and tunneling magnetoresistance (TMR), for example. The magnetic material further comprises ferromagnet material, antiferromagnet material, non-ferromagnet material, tunneling oxide material or the combination of thereof. Preferably, the magnetic field sensing layer or magnetoresistive layer is referred to the AMR, and more particularly, to the permalloy made AMR. In the present specification, the adjustives "sensing" added before components or elements is used to describe the function or effect of these components when the magnetoresistive sensing element is utilized to detect a magnetic field with respect to a specific direction. When the direction of the sensed magnetic field is changed (e.g. reversed direction), the functions or effects of these components or elements may be varied or be interchanged. Therefore, adjectives such as "sensing" that are placed before components should not limit the function or effect of those components. In the present specification, the "electrically coupled" of A and B parts means that electric current can flow from one of the A and B to the other; therefore the "electrically coupled" of A and B parts can mean that A and B are in physical contact, or having one or more conductive structures/substances are arranged between A and B for allowing A and B electrically communicating with each other.

Please refer to FIG. 2A and FIG. 2B, which illustrates top and cross-sectional views of an embodiment of a current sensor of the present invention. In this embodiment, the current sensor 2 comprises a substrate 20 and a sensing circuit 21. The substrate 20 can be a single material substrate, such as glass substrate, silicon substrate or plastic substrate. In another embodiment, the substrate 20 is not a single material substrate, and may comprise a substrate and at least one of the active components, passive components, various circuits, doped regions, interconnects and etc. The substrate 20 has a first surface 200 in a first axis (X) and a second axis (Y).

The sensing circuit 21 is formed on the first surface 200 for sensing the magnetic field (Bz) in the third axial direction (Z). In this embodiment, the sensing circuit 21 has a plurality of pairs of magnetic field sensors. In this embodiment, each magnetic field sensor is a magnetoresistive sensor composed of a magnetoresistive material. The magnetic field sensor shown in FIG. 2A has a first MR sensing group 21A and a second MR sensing group 21B. In one embodiment, the first MR sensing group 21A and the second MR sensing group 21B constitute a Wheatstone sensing circuit. Alternatively, a half-Wheatstone bridge circuit is also available. Please refer to FIG. 3A, which is a three-dimensional schematic illustration of an embodiment of a magnetic field sensor. Taking the magnetic field sensor 21a in the first MR sensing group 21A as an example, it comprises a horizontal magnetoresistive layer 210, a conductive portion 211 and a magnetic field sensing layer 212. The horizontal magnetoresistive layer 210 is formed on the first surface 200 of the substrate 20 and has a first side A and a second side B along its lengthwise extending direction (second axis Y) wherein the second side B is opposite to the first side A along its width direction (first axis X). The horizontal magnetoresistive layer 210 has first end electrically coupled to the operating voltage (Vcc) and second end opposite to the first end along the lengthwise extending direction (Y direction) electrically coupled to the ground voltage (GND).

The conductive portion 211 comprises a plurality of conductive structures 211a-211n, which are formed above or below the horizontal magnetoresistive layer 210. The horizontal magnetoresistive layer 210 and the conductive portion 211 form at least one electric current path, and the direction of the electric current 90 in the magnetoresistive layer 210 is not parallel to the lengthwise extending direction Y of the horizontal magnetoresistive layer 210. The conductive structures 211a-211n are disposed above or below the horizontal magnetoresistive layer 210 in a manner having included angle with respect to the lengthwise extending direction of the horizontal magnetoresistive layer 210 and are in electrical or physical contact with the horizontal magnetoresistive layer 210 for changing the original direction of the electric current in the magnetoresistive material of the horizontal magnetoresistive layer 210 so that the included angle is formed between the electric current direction and the magnetization direction of the magnetoresistive material, thereby increasing the sensing sensitivity of the magnetoresistive material. In the present embodiment, the plurality of conductive structures 211a-211n have the same width as well as the same spacing between each other, and each conductive structure 211a-211n has the included angle with the lengthwise extending direction (Y direction) of the horizontal magnetoresistive layer 210. The material of the conductive portion 211 can be, but should not be limited to, the metal, alloy, silicide, nanotube, conductive carbon material, and doped silicon. In addition, the structure of each conductive structure can be, but should not be limited to, line structure, discrete island structure, slice structure, through hole structure, single damascening structure or dual damascening structure fabricated by damascening process, or any combination of the previously-described structures along the horizontal or vertical direction.

Figure 3B:
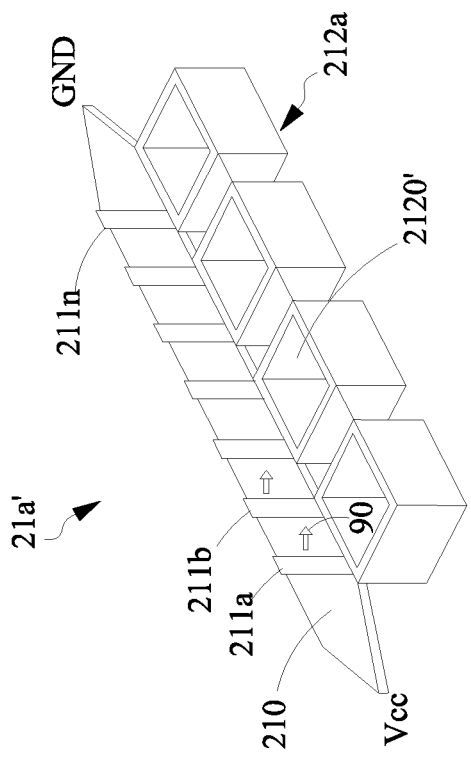
FIGS. 3A to 3C are three-dimensional schematic illustration according to different embodiments of the magnetic field sensor in the present invention.
Figure 3A:
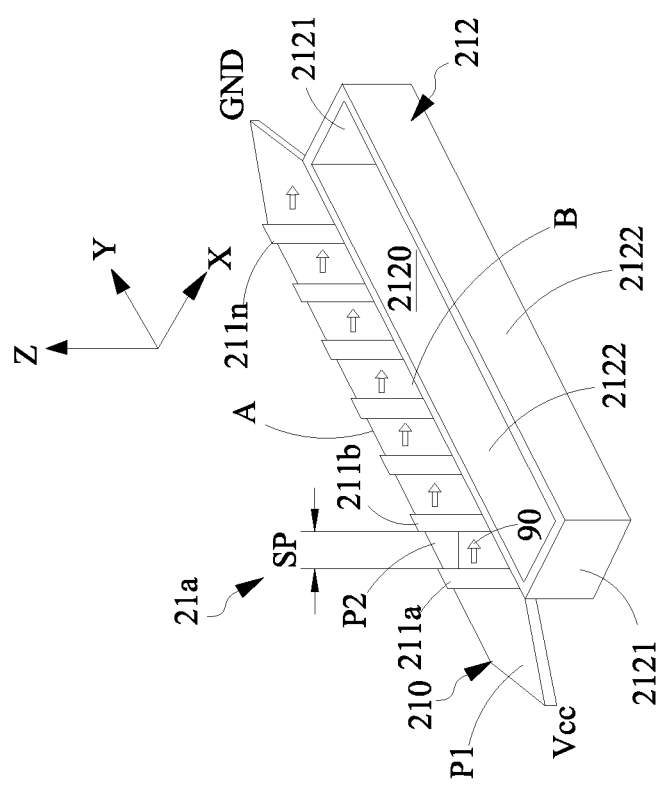

In addition, in one embodiment shown in FIG. 3A, the lengthwise extending direction of the conductive structures 211a~211n preferably forms an angle of 45±15 degrees with the lengthwise extending direction (Y direction) of the horizontal magnetoresistive layer 210. Since the conductive structures 211a~211n are made of conductive metal material, the resistivity of the conductive structures 211a~211n is much smaller than the resistivity of the magnetoresistive material of the horizontal magnetoresistive layer 210. Therefore, the location where the conductive structures 211a~211n are in physical contact with the horizontal magnetoresistive layer 210, the electric current paths will be the conductive structures 211a~211n having low resistivity; however, in the horizontal magnetoresistive layer 210 between the two adjacent conductive structures 211a to 211n, the conductive path of the electric current 90 will be the shortest path notated as SP shown in FIG. 3A between the conductive structures 211a to 211n. The horizontal magnetoresistive layer 210 and the conductive structures 211a~211n form at least one current path, i.e. portion P1 of the horizontal magnetoresistive layer 210, the conductive structure 211a, the portion P2 between the conductive structure 211a and 211b, the conductive structure 211b and so on. Based on the shape, size, and arrangement angle of the conductive structures 211a~211n, if the interval space between any two adjacent conductive structures 211a~211n is the same, the electric current 90 between any two adjacent conductive structures 211a~211n has the same electric current direction.

The magnetic field sensing layers 212 can be formed at the first side A, the second side B or the first side A and the second side B of the horizontal magnetoresistive layer 210. In the embodiment shown in FIG. 3A, the magnetic field sensing layers 212 is formed at the side B of the horizontal magnetoresistive layer 210. Each magnetic field sensing layer 212 comprises at least one sidewall. In the present embodiment, the plurality of interconnected sidewalls are connected to form a trough 2120 in the plurality of interconnected sidewalls. The magnetic field sensing layer 212 is used for sensing non-horizontal magnetic fields. In the present embodiment, the magnetic field sensing layer 212 is also formed on the substrate 20 and is almost perpendicular to the substrate 20. Alternatively, the magnetic field sensing layer 212 can also be an inclined plane, or a combination of a plurality of inclined planes, i.e., having a vertical component. In one embodiment, the trough 2120 of the magnetic field sensing layer 212 is downward extending from the one side of the horizontal magnetoresistive layer 210 and magnetically couples with the horizontal magnetoresistive layer 210 to divert or direct the sensed Z-axis magnetic moment to the horizontal magnetoresistive layer 210 thereby changing the resistance of the magnetoresistive sensing layer 210 such that a variation of output voltage is produced.

The horizontal magnetoresistive layer 210 and the magnetic field sensing layer 212 may be an integrally formed structure through the same magnetoresistive material, may be separated formed but are physically connected structures through the same or different magnetic materials, or may be a physically separated structures respectively formed by the same or different magnetic materials. It is noted that the horizontal magnetoresistive layer 210 and the magnetic field sensing layer 212 may have different thicknesses or the same thickness depending on the design requirements. It is noted that as long as the horizontal magnetoresistive layer 210 and the magnetic field sensing layer 212 are mutually close enough to magnetically influence each other, the horizontal magnetoresistive layer 210 and the magnetic field sensing layer 212 can be physically separated. In this embodiment shown in FIG. 3A, the magnetic field sensing layer 212 is formed by at least one inner sidewalls connected to each other so as to form a downward recessed trough 2120 having a long rectangular shape. In this embodiment, on the inner sidewall of the rectangular trough 2120, there are two opposite magnetoresistive layers 2121 and two opposite magnetoresistive layer 2122 that are connected to the two lateral sides of the two magnetoresistive layers 2121, respectively.

In another embodiment, as shown in FIG. 3B, the magnetic field sensor of this embodiment is basically similar to that of FIG. 3A, the difference is that in this embodiment, the magnetic field sensing layer 212a is almost perpendicular to the surface of the substrate 20, and is extending downward from one side of the horizontal magnetoresistive layer 210 thereby forming a plurality of downward recessed rectangular troughs 2120' respectively having at least one sidewall. In the present embodiment, a plurality of sidewalls are connected to each other. Each trough 2120' preferably has the same size, depth, and sidewall slope. The adjacent two troughs 2120' preferably have the same spacing. It should be noted that although the shape of the magnetic field sensing layer 212a in this embodiment is different from that in FIG. 3A, the material contained in the magnetic field sensing layer 212a, the connection (magnetic coupling) with the horizontal magnetoresistive layer 210, and the mechanism of operation, e.g. sensing the magnetic field in the Z-axis direction and diverting or directing the magnetic moment to the horizontal magnetoresistive layer 210, are all the same as the magnetic field sensing layer 212 in FIG. 3A.

Figure 3C:
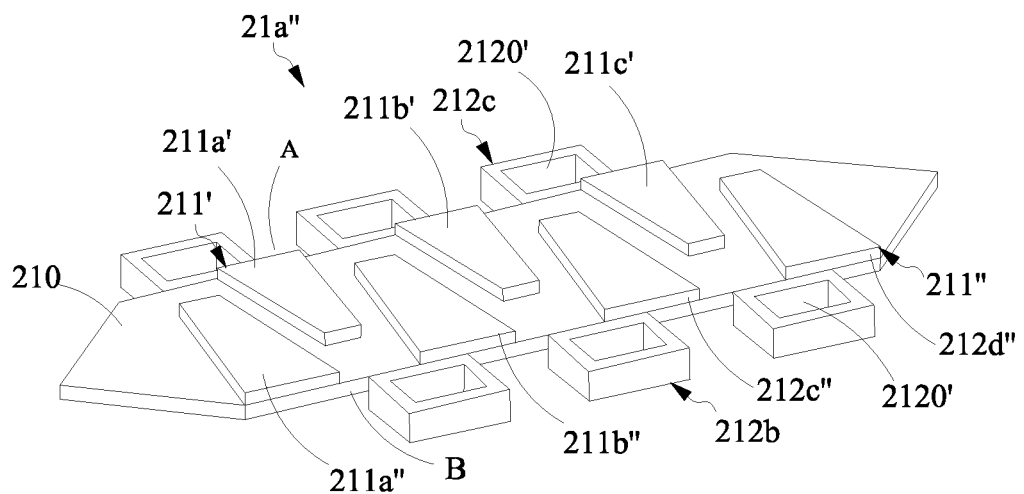

Please refer to FIG. 3C. In this embodiment, the magnetic field sensor 21a" mainly comprises a horizontal magnetoresistive layer 210, a plurality of magnetic field sensing layers 212b and 212c, and a plurality of conductive portions 211' and 211". The magnetic field sensing layers 212b and 212c in this embodiment are respectively formed at the first side A and the second side B of the horizontal magnetoresistive layer 210. The magnetic field sensing layers 212b and 212c are similar to the horizontal magnetic field sensing layer 212a in FIG. 3B, which are almost perpendicular to the surface of the substrate 20, and extend downward from each side of the horizontal magnetoresistive layer 210 so as to be magnetically coupled with the horizontal magnetoresistive layer 210.

Each magnetic field sensing layers 212b and 212c comprises a plurality of downward recessed rectangular troughs 2120'. The plurality of troughs 2120' of the magnetic field sensing layer 212b and the plurality of troughs 2120' of the magnetic field sensing layer 212c are the same as the plurality of troughs 2120' of the magnetic field sensing layer 212a shown in FIG. 3B, which will not be described hereinafter. In this embodiment, the plurality of troughs 2120' of the magnetic field sensing layer 212b and the plurality of troughs 2120' of the magnetic field sensing layer 212c are staggered with each other. In one embodiment, the troughs 2120' of the magnetic field sensing layer 212b and the troughs 2120' of the magnetic field sensing layer 212c may be partially overlapped or completely non-overlapped in the staggered region. In the staggered region shown in FIG. 3C, staggered arrangement between the troughs 2120' of the magnetic field sensing layer 212b and the troughs 2120' of the magnetic field sensing layer are completely non-overlapped.

In one embodiment, the troughs 2120' at each of the first side A or second side B have the same size, depth, and sidewall slope, so that each of the troughs 2120' of the magnetic field sensing layers 212b and 212c has approximately the same area and thickness. The adjacent troughs 2120' respectively arranged at the first side A and the second side B have the same spacing. It should be noted that, although the downward recessed trough 2120' in this embodiment have the same shape, size, and sidewall slope, this is not a limitation, which is determined according to the user's needs. In addition, the conductive structures 211a'~211c' of the conductive portions 211' located on the horizontal magnetoresistive layer 210 are extended from the second side A toward the second side B. The conductive structures 211a"~211d" of the conductive portions 211" located on the horizontal magnetoresistive layer 210 are extended from the second side B toward the first side A. The conductive structures 211a'~211c' and the conductive structures 211a"~211d" are alternately arranged along the lengthwise extending direction of the horizontal magnetoresistive layer 210. It should be noted that, although the conductive structures of the conductive portions 211' and 211" in this embodiment have the same shape, size, and the same spacing and are disposed in a staggered arrangement, this is not a limitation. Alternatively, the conductive structures can also have other kinds of shapes and size, which is determined according to the user's needs. The conductive portion 211' of the first side A and the conductive portion 211" of the second side B are made of electrically conductive metal material whose resistivity is much lower than resistivity of the magnetoresistive material of the horizontal magnetoresistive layer 210. Therefore, in the contact area between the conductive portion 211' at first side A and the horizontal magnetoresistive layer 210 as well as the contact area between the conductive portion 211" at the second side B and the horizontal magnetoresistive layer 210, the electric current path will be the first side conductive portion 211' and the second side conductive portion 211" having relatively low resistivity.

Referring back to FIG. 2A and FIG. 4A, wherein FIG. 4A is a schematic illustration of a Wheatstone sensing circuit composed of a plurality of magnetic field sensors. In this embodiment, the magnetic field sensors 21a~21b of the first MR sensing group 21A are the upper half of the Wheatstone sensing circuit 9, and the magnetic field sensors 21c~21d in the second MR sensing group 21B are the lower half of the Wheatstone sensing circuit 9. The magnetic field sensors 21a to 21d in this embodiment are implemented by using the structure shown in FIG. 3A. The Wheatstone sensing circuit 9 is constituted by the magnetic field sensors 21a~21d of the first MR sensing group 21A and the second MR sensing group 21B, and the magnetic field sensors 21a and 21b of the first MR sensing group 21A have a symmetrical conductive structures 211, which generates the magnetization direction M the same as the +Y direction. Likewise, the magnetic field sensors 21c and 21d of the second MR sensing group 21B have symmetrical conductive structures 211, and generate the magnetization direction M the same as the −Y direction. As shown in FIG. 4B, it is a schematic illustration of another embodiment of the Wheatstone sensing circuit. The first MR sensing group 21A' in the Wheatstone sensing circuit 9a in this embodiment is located in the left half, and the second MR sensing group 213 is located in the right half. The magnetic field sensors 21a and 21b of the first MR sensing group 21A' have a symmetric conductive structures 211 to generate the magnetization direction M the same as the +Y direction. Similarly, the magnetic field sensors 21c and 21d of the second MR sensing group 213 have a symmetrical conductive structures 211, for generating a magnetization direction M the same as the +Y direction. In the sensing circuits of FIGS. 4A and 4B, the signal drift due to the external field interference and temperature variation can be shielded. Through the blocks 21A and 21B of FIG. 4A or 21A' and 213 of FIG. 4B, magnetic fields Bz1 and Bz2 having different magnetic direction induced due to the electric current to be measured passing through can increase the sensitivity and improve the effect of differential amplification of the electric signals.

Referring back to FIG. 2A and FIG. 2B, a set/reset circuit 213 is provided above the magnetic field sensors 21a~21d. A shield structure 22 is further provided above the entire magnetic field sensors 21a~21d to shield the interference generated by the external magnetic field of the first axis X or the second axis Y during sensing process. In addition, a loop circuit 23 is arranged around the periphery of the sensing circuit 21. The Wheatstone sensing circuit is formed within the loop circuit 23. In the present embodiment, the loop circuit 23 has a first wire 230 for guiding an electric current 90 into the loop circuit 23, and has a second wire 231 for guiding the electric current 90 out of the loop circuit 23.

Figure 5A:
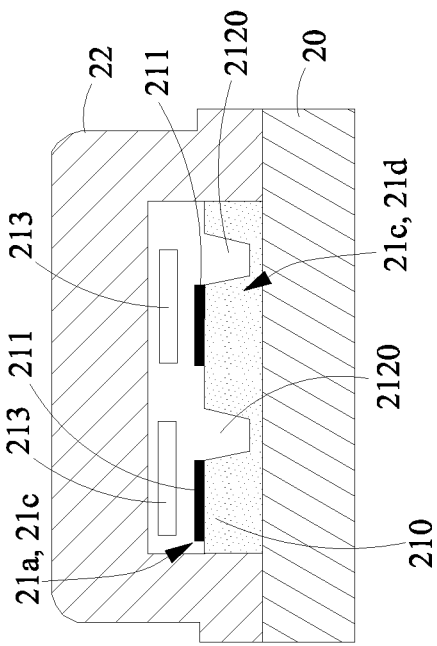
FIGS. 5A to 5D are schematic cross-sectional views of different embodiments of the current sensor of the present invention.
Figure 5B:
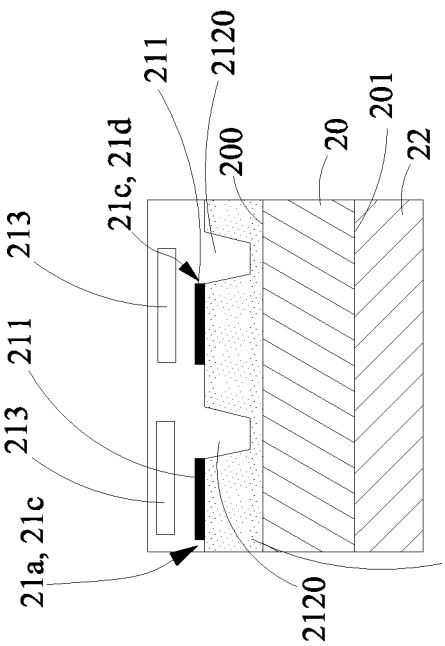
Figure 5C:
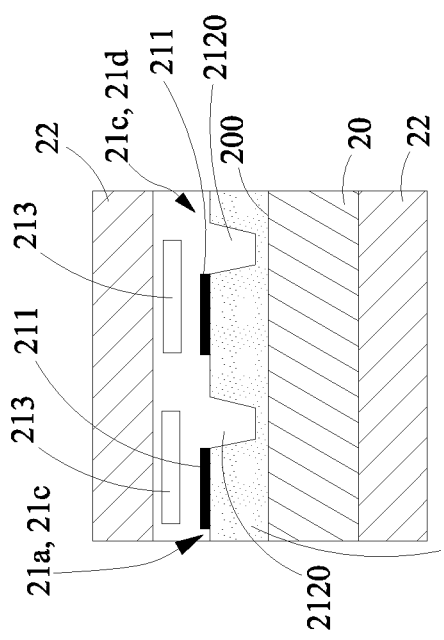
Figure 5D:
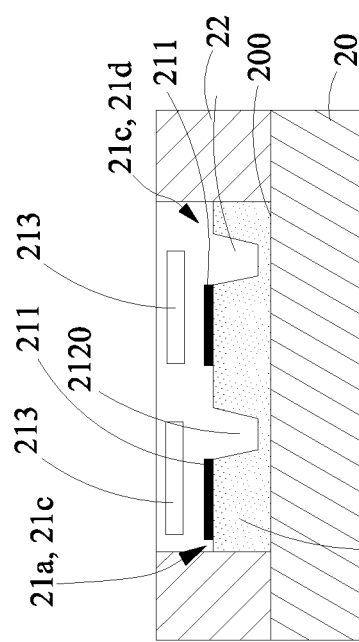

The positions of the shield structures 22 on the magnetic field sensors 21a~21d are not limited by the arrangement shown in FIG. 2B. For example, as shown in FIG. 5A, in this embodiment, the shield structure 22 is formed on the surface 200 of the substrate 20 and completely covers the surrounding of the magnetic field sensors 21a~21d. As shown in FIG. 5B, in this embodiment, the shield structure 22 is not formed above the magnetic field sensors 21a to 21d as shown in FIG. 2B or FIG. 5A, but is formed on the second surface 201 at the other side of the substrate 20 opposite to the first surface 200. In another embodiment, as shown in FIG. 5C, the shield structure 22 in this embodiment is formed below the substrate 20 and above the magnetic field sensors 21a~21d. In another embodiment, as shown in FIG. 5D, in this embodiment, the shield structure 22 is arranged around the lateral surfaces of the magnetic field sensors 21a~21d. It is noted that, the structures shown in FIGS. 2A~2B, and 5A~5D, described above are structures with a current sensor function manufactured through a semiconductor process, and it can be subsequently packaged through a packaging processes so as to integrate the current sensor into the chip.

Figure 6A:
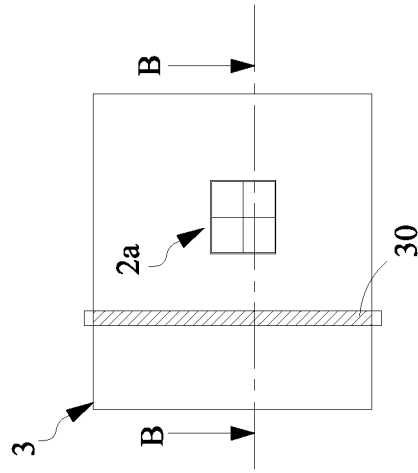
FIG. 6A is a schematic illustration of a package structure with a current sensor according to one embodiment of the present invention.
Figure 6B:
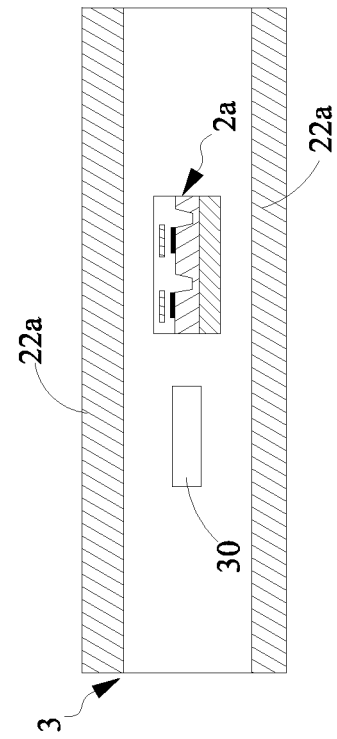
FIG. 6B is a schematic cross-sectional view of the package structure of FIG. 6A.
Figure 6C:
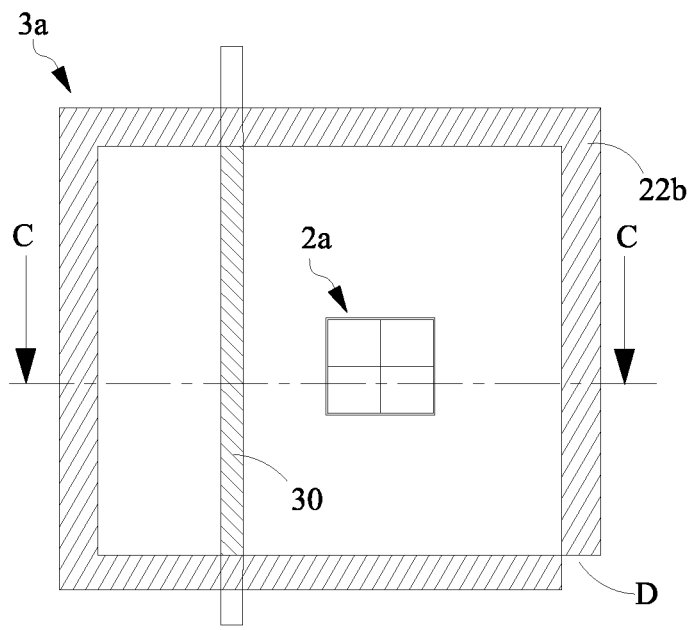
FIG. 6C is a schematic illustration of a package structure with a current sensor according to another embodiment of the present invention.
Figure 6D:
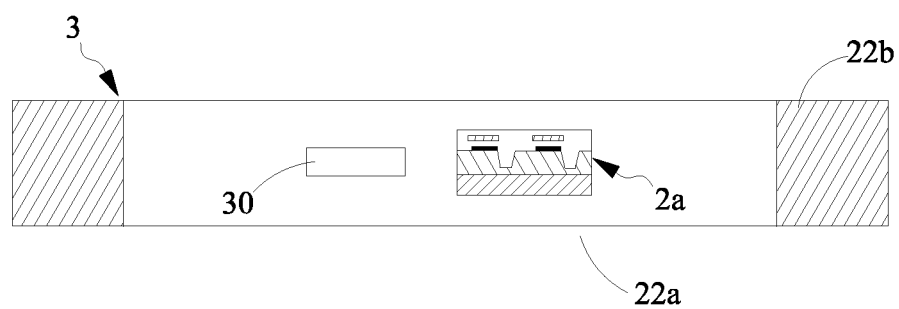
FIG. 6D is a schematic cross-sectional view of another package structure of FIG. 6C.

In another embodiment, as shown in FIG. 6A and FIG. 6B, wherein FIG. 6B is a schematic cross-sectional view of FIG. 6A. The different part from the above-mentioned embodiments is that the package structure 22a of this embodiment is not formed at one side of the magnetic field sensor through a semiconductor process. In the present embodiment, the electric current sensor 2a inside the package structure 3 is disposed at one side of the wire 30 in the package structure 3. It should be noted that the current sensor 2a in this embodiment does not have the shield structure like any one of embodiments shown in FIGS. 2A~2B and FIGS. 5A to 5D arranged on one side of the wire 30. In FIG. 6A, shield structures 22a are respectively arranged on the top and bottom surfaces of the package structure 3. In another embodiment, as shown in FIG. 6B and FIG. 6C, the embodiments are basically similar to the embodiment shown in FIG. 6A, the different part is that the shield structure 22b in this embodiment is disposed around the peripheral of the packaging structure 3a. In one embodiment, the shield structure 22b surrounding the package structure 3a may completely enclose the package structure 3a. Alternatively, the package structure 3 may have a notch D as shown in FIG. 6C.

Figure 7:
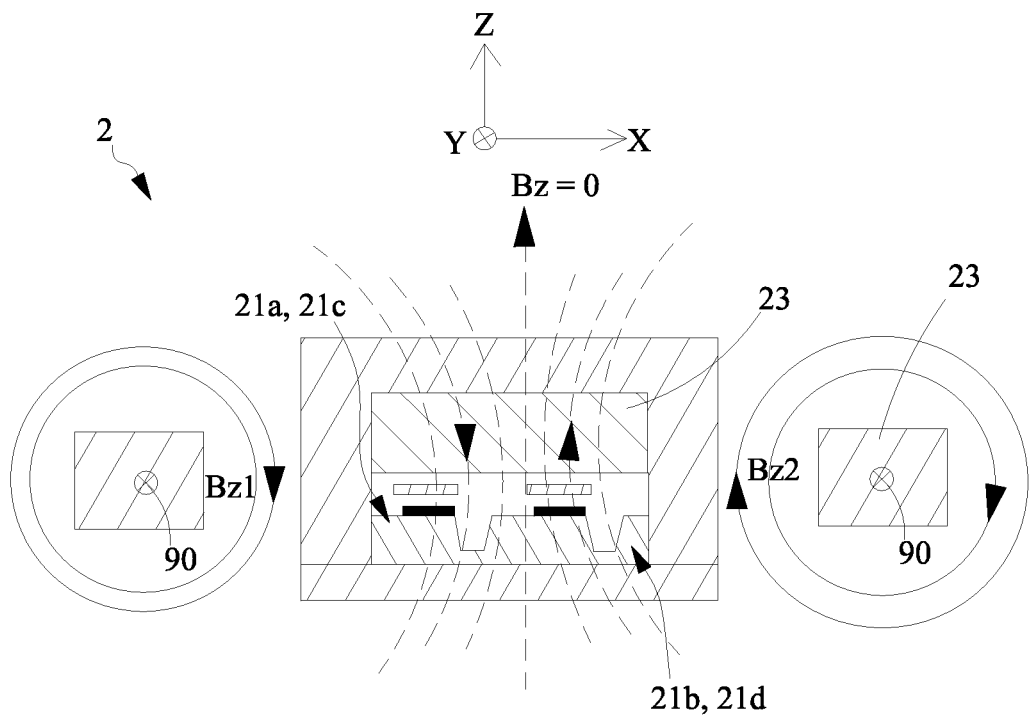
FIG. 7 is a schematic illustration showing the enhancement of the vertical magnetic field of the current sensor of the present invention.

Please refer to FIG. 7, which is a schematic diagram of the operation of the current sensor of the present invention. The current sensor shown in 2B is used as an exemplary embodiment. When the current sensor 2 is operated, the shield structure 22 can shield the magnetic field in the horizontal direction (XY) while the magnetic field Bz in the Z-axis direction can be concentrated to the magnetic group sensors 21a~21d through the magnetic fields Bz1 and Bz2 generated by the loop 23. The Wheatstone sensing circuit formed by the symmetrical conductive structures can offset the magnetic field in the Z-axis direction of the external environment, so that the magnetic field generated by the electric current (I) can be accurately sensed by the magnetic field sensors 21a~21d thereby calculating the magnitude of the current (I).

Figure 8A:
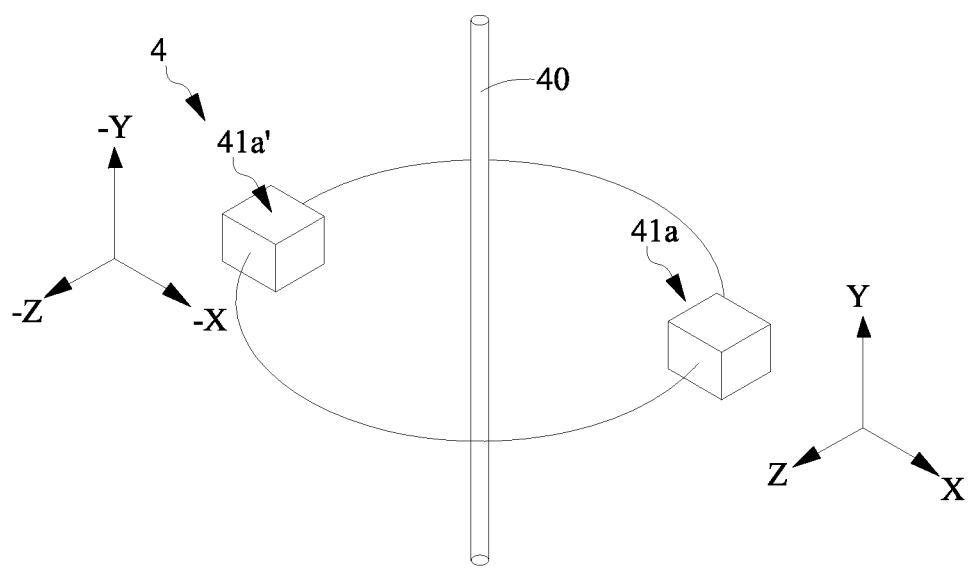
FIG. 8A is a schematic illustration of another embodiment of the current sensing device of the present invention.

Please refer to FIG. 8A, which is a schematic diagram of another embodiment of the current sensing device of the present invention. In this embodiment, the current sensing device 4 is used to sense the current of the wire 40 along the Y-axis direction. The current sensing device 4 comprises a pair of current sensors 41a and 41a' symmetrically arranged at two separated sides of the conductive wire 40 such that the conductive wire 40 is located between the pair of current sensors 41a and 41a', wherein the structure of each current sensor 41a and 41a' can be, but should not be limited to, the embodiments of the current sensors 41a~41d shown in FIGS. 9A to 9D.

Figure 9C:
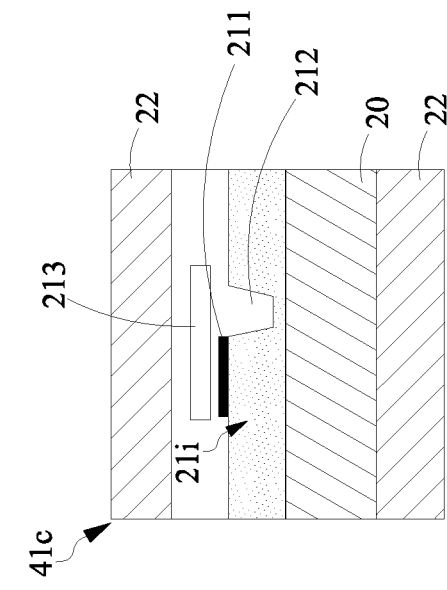
FIGS. 9A to 9D respectively illustrates different embodiments associated with the current sensor and its magnetic field sensing element used in the current sensing device shown in FIG. 8A of the present invention.
Figure 9D:
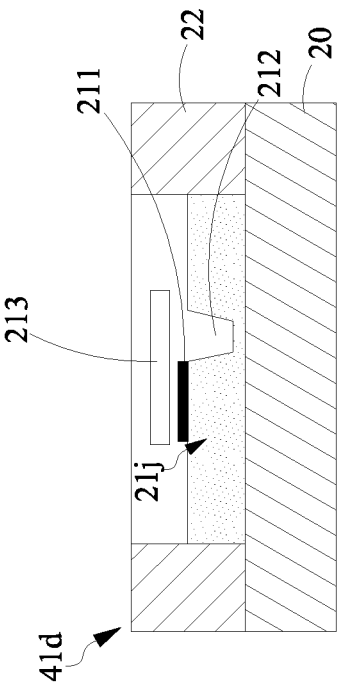
Figure 9A:
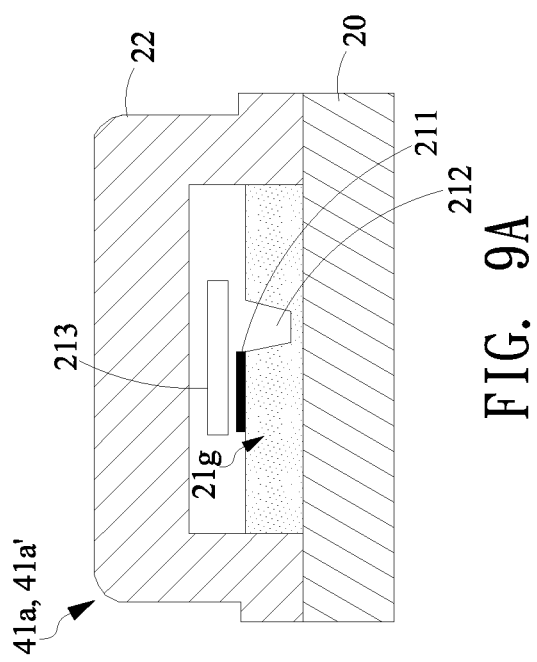
Figure 9B:
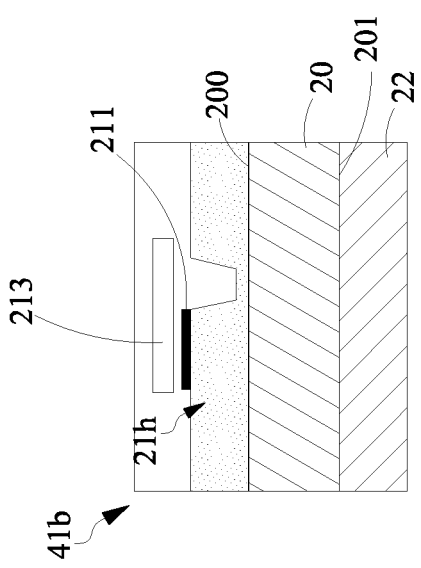

In this embodiment, the structure of current sensors shown in FIG. 9A are used as the exemplary embodiment of the current sensors 41a and 41a' shown in FIG. 8A. The current sensors 41a and 41a' further comprises the substrate 20, the magnetic field sensor 21g and the shield structure 22. The substrate 20 and the shield structure 22 are basically similar to those embodiments described previously, and the different part is that there is a single magnetic field sensor 21g in this embodiment. The magnetic field sensor 21g also has the horizontal magnetoresistive layer 210, the conductive portion 211 and the magnetic field sensing layer 212, each of which are the same as the above-mentioned embodiments and will not be described hereinafter. The magnetic field sensor 21g of the current sensor 41a is used to sense the magnetic field (Bz) about the third axis, and the magnetic field sensor 21g of the current sensor 41a' is used to sense the opposite magnetic field (Bz) about the third axis.

Figure 8B:
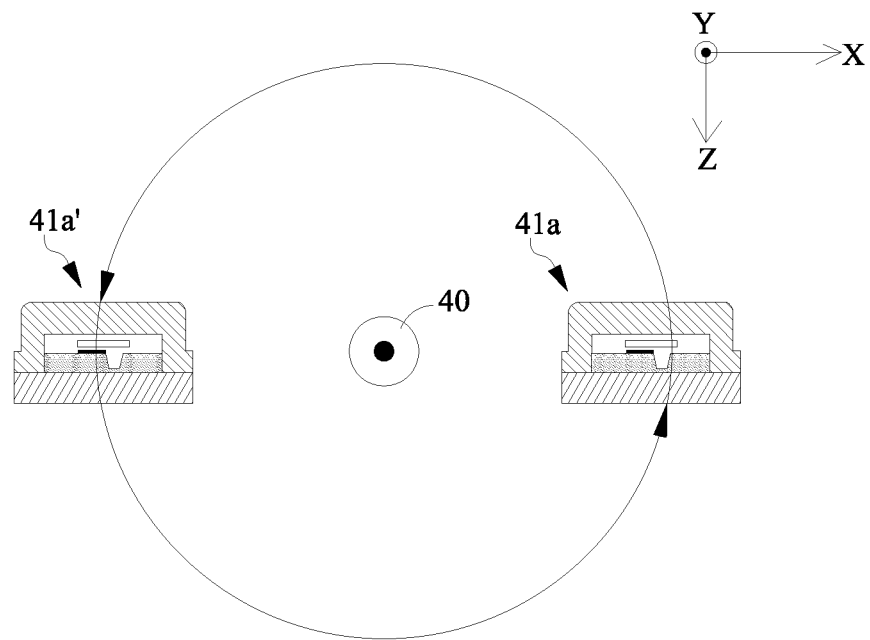
FIGS. 8B to 8C are schematic cross-sectional views of the current sensing device respectively shown in FIG. 8A on the XZ plane.
Figure 8C:
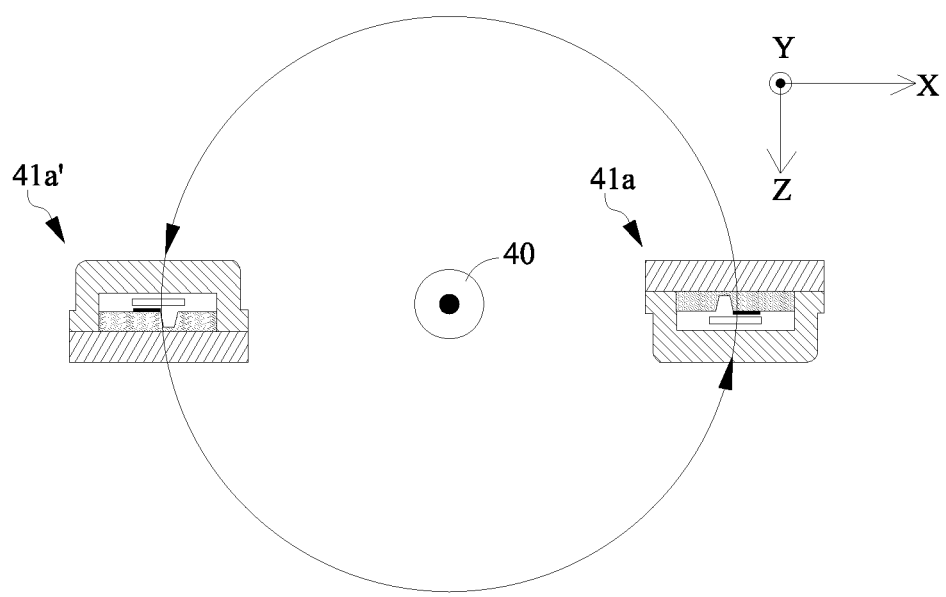

In the embodiment of FIG. 8A, due to the paired current sensors 41a and 41a', the shield structure 22 can not only shield the magnetic field in the horizontal direction, but also can offset the external magnetic field with respect to the environment in the Z-axis direction, so that the paired current sensors 41a and 41a' can accurately sense the directional magnetic field Bz generated by the electric current (I) through the multiplication of the detected signal, which is different from offsetting the external environmental magnetic field in the Z-axis direction, thereby obtaining the magnitude of the current passing through the wire 40. It is noted that, in the embodiment shown in FIG. 8B, the paired current sensors 41a and 41a' are arranged with respect to the same direction whereby the detected signal are subtracted while in the embodiment shown in FIG. 8C, the paired current sensors 41a and 41a' are arranged with respect to the opposite direction whereby the detected signals are added up. According to the explanation above, the current sensing device shown in FIG. 8A can not only eliminate and offset the external environmental magnetic field in the Z-axis direction, but also multiply the Z-axis magnetic field generated by the electric current (I), thereby accurately obtaining the electric current (I) passing through the conductive wire.

Figure 4A:
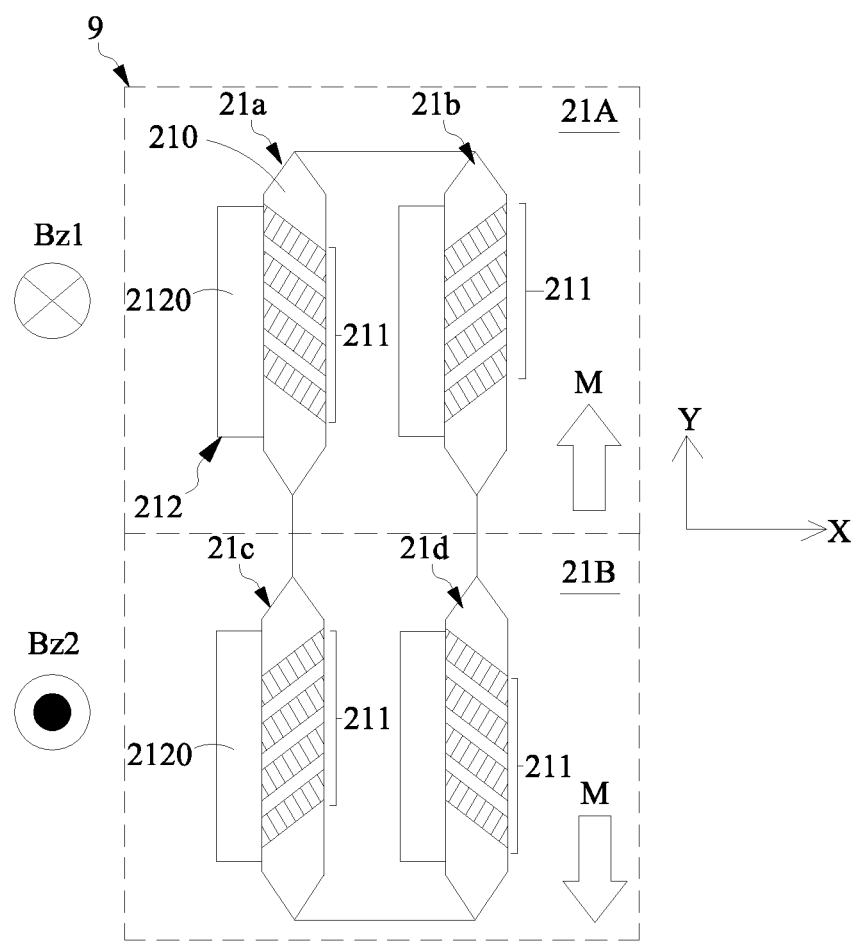
FIGS. 4A and 4B are schematic diagrams of the Wheatstone sensing circuit according to different embodiments of the present invention.
Figure 4B:
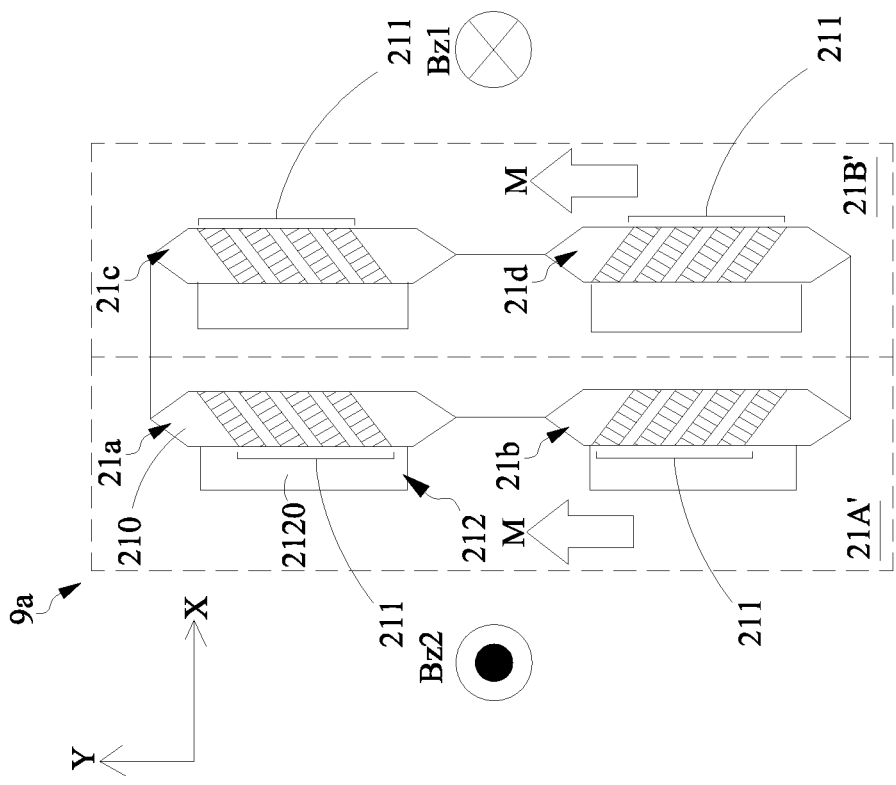
Figure 10:
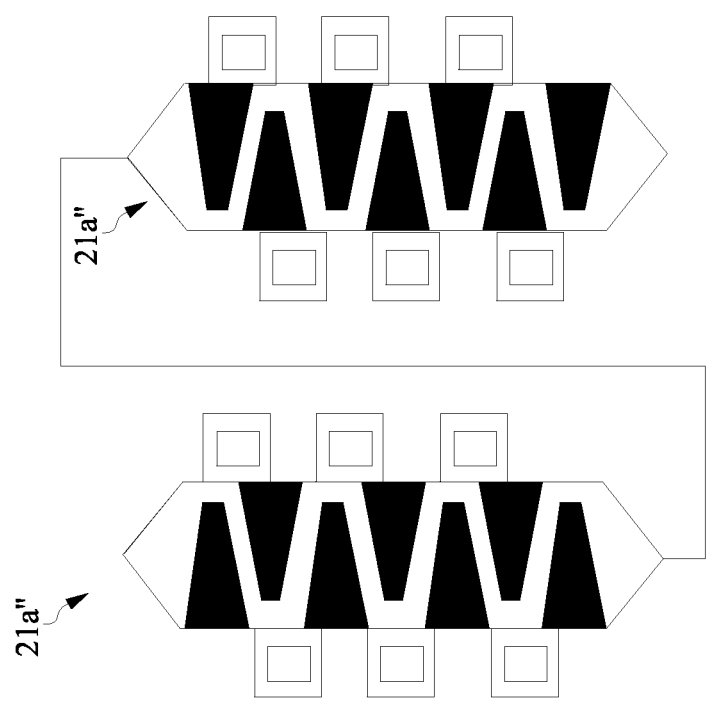
FIG. 10 is a schematic illustration of the sensing circuit according to another embodiment of the present invention.

It is noted that, as shown in FIG. 10, a single magnetic field sensor 21a'' shown in FIG. 3C having electric current flowing therethrough for generating magnetic field having different direction can replace the magnetic field sensor 21a and 21b in each MR sensing group 21A and 21B in FIG. 4A, thereby achieving equivalent effect of the Wheatstone sensing circuit 9 shown in FIG. 4A. Alternatively, a pair of magnetic field sensors 21a' shown in FIG. 3B can be utilized to replace the magnetic field sensor 21a and 21b in each MR sensing group 21A and 21B in FIG. 4A, thereby achieving equivalent effect of the Wheatstone sensing circuit 9 shown in FIG. 4A. In the embodiment shown in FIG. 10, two magnetic field sensor 21a'' generate equivalent effect of the Wheatstone sensing circuit 9 shown in FIG. 4A, wherein the layout of the half-side conductive portion and the initial magnetization vector can also be varied and the two magnetic field sensors 21a'' are divided into two groups having mirror-symmetrical arranged to each other thereby achieving the same effect as the first and second MR sensing groups 21A and 21B in FIG. 4A. The above-mentioned purpose is to shield the signal drift when the external field interference and temperature changes. It is noted that when the first MR sensing group 21A and the second MR sensing group 21B shown in FIG. 4A is utilized, the electric current under detect will induce magnetic field Bz1 and Bz2 having opposite direction to each other, whereby the signal can be multiplied. When four magnetic field sensors are utilized to form a Wheatstone bridge shown in FIG. 4A, the sensitivity can be multiplied and the differential amplification of the output signal can be conveniently improved. Therefore, the two groups formed in the present invention, such as 21A and 21B in FIG. 4A for example, can refer to the arrangement design to shield the external magnetic field, and can also strengthen the signal amplification at the same time. Alternatively, the magnetic field sensors can also be utilized to form a half-Wheatstone bridge circuit.

It is also noted that due to the magnetic field having different direction generated by the electric current under test, the quantities of MR magnetic field sensors and the variation of the current circuit where the electric current to be measured flows, e.g., single circuit or loop circuit, should not be the limitation of the present invention. In addition, the initial magnetization direction of the MR magnetic field sensors, and the combination of the distribution of the conductive portion and the magnetic field sensing layer are not the limitation to the present invention as well. In addition to shielding the horizontal magnetic field, the shield structure can also strengthen the magnetic field strength and distribution of the magnetic field to be measured. It is also noted that the shape, size, quantities, magnetic material and arrangement location of the shield structure, e.g., formed within the package structure or outside the package structure, should not be the limitation of the present invention as well.

While the present invention has been particularly shown and described with reference to a preferred embodiment, it will be understood by those skilled in the art that various changes in form and detail may be without departing from the spirit and scope of the present invention.

What is claimed is:
1. An electric current sensor, comprising:
   a substrate, configured to have a first surface defined by a first axis and a second axis;
   a shield structure, arranged at top side of the electric current sensor, bottom side of the electric current sensor or arranged around the electric current sensor for shielding an external magnetic field along the first axis and the second axis;
   a sensing circuit, formed on the first surface and configured to detect a magnetic field along a third axis, the sensing circuit comprising a plurality of pairs of magnetic field sensors, and each magnetic field sensor further comprising:
      a horizontal magnetoresistive layer, arranged above the first surface and configured to have a first side along a lengthwise direction thereof and a second side opposite to the first side;
      a conductive portion, formed at top side or bottom side of the horizontal magnetoresistive layer and configured to have a plurality of conductive structures; and
      at least one magnetic field sensing layer, formed at the first side of the horizontal magnetoresistive layer or at the second side of the horizontal magnetoresistive layer, each magnetic field sensing layer comprising at least one sidewall connected to each other; and
   a loop circuit, arranged around the periphery of the sensing circuit for generating a first magnetic field along the third axis, and a second magnetic field along the third axis, wherein the magnetic field along the third axis is concentrated to the magnetic field sensors through the first magnetic field and the second magnetic field along the third axis generated by the loop circuit.

2. The electric current sensor of claim 1, wherein the plurality of pairs of the magnetic field sensors constitute a Wheatstone bridge circuit, or a half-Wheatstone bridge circuit.

3. The electric current sensor of claim 1, further comprising the loop circuit having a hollow space in which the sensing circuit is formed, and the loop circuit further comprising a first conductive wire for guiding an electrical current entering into the loop circuit, and a second conductive wire for guiding the electrical current out of the loop circuit.

4. The electric current sensor of claim 1, wherein at least one electrical current path is formed by the horizontal magnetoresistive layer and the conductive portion, and an included angle is defined between a direction of an electric current and the lengthwise direction of the horizontal magnetoresistive layer.

5. The electric current sensor of claim 1, wherein the at least one magnetic field sensing layer is formed at the first side of the horizontal magnetoresistive layer and the second side of the horizontal magnetoresistive layer.

6. An electric current sensor, comprising:
   a substrate, configured to have a first surface defined by a first axis and a second axis;
   a magnet field sensor, formed on the first surface and configured to detect a magnetic field associated with a third axis, the magnet field sensor further comprising:
      a horizontal magnetoresistive layer, formed on the first surface of the substrate and configured to have a first side along a lengthwise direction thereof, and a second side opposite to the first side;
      a conductive portion, formed on top side or bottom side of the horizontal magnetoresistive layer and configured to have a plurality of conductive structures; and at least one magnetic field sensing layer, formed at the first side of the horizontal magnetoresistive layer or at the second side of the horizontal magnetoresistive layer, each magnetic field sensing layer comprising at least one sidewall connected to each other; and a shield structure, arranged at top side of the electric current sensor, bottom side of the electric current sensor or arranged around the electric current sensor for shielding an external magnetic field along the first axis and the second axis; and a loop circuit, arranged around the periphery of the sensing circuit for generating a first magnetic field along the third axis, and a second magnetic field along the third axis, wherein the magnetic field along the third axis is concentrated to the magnetic field sensors through the first magnetic field and the second magnetic field along the third axis generated by the loop circuit.

7. The electric current sensor of the claim 6, wherein a package structure is configured to package the electric current sensor, wherein the shield structure is formed within the package structure or outside the package structure.

8. The electric current sensor of claim 6, wherein at least one electrical current path is formed by the horizontal magnetoresistive layer and the conductive portion, and an included angle is defined between a direction of an electric current and the lengthwise direction of the horizontal magnetoresistive layer.

9. The electric current sensor of claim 6, wherein the at least one magnetic field sensing layer is formed at the first side of the horizontal magnetoresistive layer and the second side of the horizontal magnetoresistive layer.

10. An electric current sensing device for detecting an electric current of a conductive wire along a second axis, the electric current sensing device comprising:

a pair of electric current sensors, respectively and symmetrically arranged at two opposite sides of the conductive wire such that the conductive wire is located between the pair of the electric current sensors, each electric current sensor comprising:

a substrate, configured to have a first surface defined by a first axis and a second axis;

a magnetic field sensor, arranged on the first surface for detecting a magnetic field associated with a third axis, the magnetic field sensor further comprising:

a horizontal magnetoresistive layer, formed on the first surface of the substrate, and configured to have a first side along a lengthwise direction thereof and a second side opposite to the first side;

a conductive portion, formed on top side or bottom side of the horizontal magnetoresistive layer and configured to have a plurality of conductive structures; and at least one magnetic field sensing layer, formed at the first side of the horizontal magnetoresistive layer or at the second side of the horizontal magnetoresistive layer, each magnetic field sensing layer comprising at least one sidewall connected to each other; and a shield structure, arranged at top side of the electric current sensor, bottom side of the electric current sensor or arranged around the electric current sensor for shielding an external magnetic field along the first axis and the second axis.

11. The device of the claim 10, wherein a package structure is configured to package the electric current sensor, wherein the shield structure is formed within the package structure or outside the package structure.

12. The device of claim 10, wherein at least one electrical current path is formed by the horizontal magnetoresistive layer and the conductive portion, and an included angle is defined between a direction of an electric current and the lengthwise direction of the horizontal magnetoresistive layer.

13. The device of claim 10, wherein the at least one magnetic field sensing layer is formed at the first side of the horizontal magnetoresistive layer and the second side of the horizontal magnetoresistive layer.

* * * * *